United States Patent
Wang et al.

(10) Patent No.: US 11,334,202 B2
(45) Date of Patent: May 17, 2022

(54) TOUCH PANEL, CONTROL METHOD AND CONTROL DEVICE THEREOF, AND DISPLAY DEVICE

(71) Applicants: ORDOS YUANSHENG OPTOELECTRONICS CO., LTD., Inner Mongolia (CN); BOE TECHNOLOGY GROUP CO., LTD., Beijing (CN)

(72) Inventors: Bo Wang, Beijing (CN); Fuqiang Li, Beijing (CN)

(73) Assignees: ORDOS YUANSHENG OPTOELECTRONICS CO., LTD., Inner Mongolia (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/043,436

(22) PCT Filed: Mar. 2, 2020

(86) PCT No.: PCT/CN2020/077384
§ 371 (c)(1),
(2) Date: Sep. 29, 2020

(87) PCT Pub. No.: WO2020/182002
PCT Pub. Date: Sep. 17, 2020

(65) Prior Publication Data
US 2021/0026494 A1    Jan. 28, 2021

(30) Foreign Application Priority Data
Mar. 11, 2019    (CN) .......................... 201910179213.8

(51) Int. Cl.
*G06F 3/044*    (2006.01)
*G06F 3/041*    (2006.01)
(Continued)

(52) U.S. Cl.
CPC .......... *G06F 3/0443* (2019.05); *G06F 3/0416* (2013.01); *G06V 40/1306* (2022.01); *H03K 17/9622* (2013.01)

(58) Field of Classification Search
USPC ........................................................ 345/173
See application file for complete search history.

(56) References Cited

U.S. PATENT DOCUMENTS

2014/0047706 A1    2/2014  Shaikh et al.
2015/0071511 A1*   3/2015  Wang ................. G06V 40/1306
                                              382/124
(Continued)

FOREIGN PATENT DOCUMENTS

CN    102566840 A    7/2012
CN    105793869 A    7/2016
(Continued)

OTHER PUBLICATIONS

First Office Action dated Mar. 13, 2020, relating to CN Patent Application No. 201910179213.8.
(Continued)

*Primary Examiner* — Chineyere D Wills-Burns
(74) *Attorney, Agent, or Firm* — Dinsmore & Shohl LLP

(57) ABSTRACT

The disclosure provides a touch panel, a control method and a control device thereof, and a display device. The touch panel comprises at least one first touch area and at least one second touch area, wherein a density of touch electrodes in the first touch area is greater than a density of touch electrodes in the second touch area.

15 Claims, 5 Drawing Sheets

(51) Int. Cl.
  *G06V 40/13* (2022.01)
  *H03K 17/96* (2006.01)

(56) References Cited

U.S. PATENT DOCUMENTS

| | | | |
|---|---|---|---|
| 2016/0063301 A1* | 3/2016 | Wu | G06V 40/1306 |
| | | | 382/124 |
| 2016/0283022 A1* | 9/2016 | Yang | G06V 40/13 |
| 2016/0364593 A1* | 12/2016 | Lee | G06F 3/04164 |
| 2017/0083735 A1* | 3/2017 | Wen | G06V 40/1306 |
| 2017/0193265 A1 | 7/2017 | Chan et al. | |
| 2017/0206392 A1* | 7/2017 | Zhu | G06F 3/04166 |
| 2018/0181735 A1* | 6/2018 | Yang | H04W 12/06 |
| 2018/0224955 A1* | 8/2018 | Chen | G06K 9/00 |
| 2019/0004663 A1 | 1/2019 | Li et al. | |
| 2019/0018540 A1 | 1/2019 | Ko et al. | |
| 2019/0057240 A1* | 2/2019 | Li | G06V 10/98 |
| 2019/0171306 A1* | 6/2019 | Kim | G06V 40/1306 |
| 2019/0302934 A1* | 10/2019 | Rhe | G06F 3/0446 |
| 2020/0160022 A1* | 5/2020 | Li | G06F 3/04166 |
| 2021/0026494 A1 | 1/2021 | Wang et al. | |
| 2021/0165533 A1* | 6/2021 | Hou | G06F 3/0443 |

FOREIGN PATENT DOCUMENTS

| | | |
|---|---|---|
| CN | 106293287 A | 1/2017 |
| CN | 107346195 A | 11/2017 |
| CN | 108319886 A | 7/2018 |
| CN | 109240528 A | 1/2019 |
| CN | 109359584 A | 2/2019 |
| CN | 109901757 A | 6/2019 |
| EP | 3349148 A2 | 7/2018 |
| KR | 20170081017 A | 7/2017 |

OTHER PUBLICATIONS

Second Office Action dated Sep. 7, 2020, relating to CN Patent Application No. 201910179213.8.
Third Office Action dated Jan. 7, 2021, relating to CN Patent Application No. 201910179213.8.

* cited by examiner

TOUCH PANEL, CONTROL METHOD AND CONTROL DEVICE THEREOF, AND DISPLAY DEVICE

CROSS-REFERENCE TO RELATED APPLICATIONS

The present application is a U.S. National Stage Application under 35 U.S.C. § 371 of International Patent Application No. PCT/CN2020/077384, filed on Mar. 2, 2020, which is based on and claims priority from CN application No. 201910179213.8, filed on Mar. 11, 2019, the disclosure of both of which are hereby incorporated into this disclosure by reference in its entirety.

TECHNICAL FIELD

The present disclosure relates to the field of display technologies, and in particular, to a touch panel, a control method and a control device thereof, and a display device.

BACKGROUND

In the related art, when a user performs a fingerprint identification operation through the touch panel, a capacitance between touch electrodes in the corresponding area changes. Through the detection of the capacitance variation, the fingerprint of the user can be identified.

SUMMARY

According to a first aspect of the embodiments of the present disclosure, there is provided a touch panel comprising: at least one first touch area and at least one second touch area; a density of touch electrodes in the at least one first touch area is greater than a density of touch electrodes in the at least one second touch area.

In some embodiments, each of the at least one first touch area and each of the at least one second touch area have a side length of 4 mm to 5 mm.

In some embodiments, the touch panel further comprising: a control device configured to detect whether a user performs a fingerprint identification operation in the at least one first touch area, and control touch electrodes in touch areas in the touch panel other than a first touch area where the user performs the fingerprint identification operation to be grounded under a condition that the user performs the fingerprint identification operation in the at least one first touch area.

In some embodiments, the control device is further configured to detect whether a grounded touch electrode exists in the touch panel under a condition that the user does not perform a fingerprint identification operation in the at least one first touch area, and control the grounded touch electrode in the touch panel to return to an operating state under a condition that the grounded touch electrode exists in the touch panel.

In some embodiments, the control device is further configured to detect whether there is a first touch area with a capacitance variation exceeding a variation threshold in the at least one first touch area in the touch panel, and take the first touch area with the capacitance variation exceeding the variation threshold as a first touch area for the user to perform the fingerprint identification operation under a condition that there is the first touch area with the capacitance variation exceeding the variation threshold.

In some embodiments, the control device is further configured to detect whether a duration of the capacitance variation exceeding a variation threshold exceeds a duration threshold under a condition that there is the first touch area where the capacitance variation exceeding the variation threshold, and take the first touch area where the capacitance variation exceeding the variation threshold as the first touch area where the user performs a fingerprint identification operation under a condition that the duration of the capacitance variation exceeding the variation threshold exceeds the duration threshold.

In some embodiments, the control device is further configured to send a first touch information to the touch electrodes in the first touch area where the user performs the fingerprint identification operation under a condition that the user performs the fingerprint identification operation in the at least one first touch area, and send a second touch information to the touch electrodes in the first touch area where the user performs a touch operation under a condition that the user performs the touch operation in the at least one first touch area, wherein a frequency of the first touch information is greater than a frequency of the second touch information.

According to a second aspect of the embodiments of the present disclosure, there is provided a display device comprising a touch panel, the touch panel comprising: at least one first touch area and at least one second touch area, wherein a density of touch electrodes in the at least one first touch area is greater than a density of touch electrodes in the at least one second touch area.

In some embodiments, the touch panel further comprises: a control device configured to detect whether a user performs a fingerprint identification operation in the at least one first touch area, and control touch electrodes in touch areas in the touch panel other than a first touch area where the user performs the fingerprint identification operation to be grounded under a condition that the user performs the fingerprint identification operation in the at least one first touch area.

In some embodiments, the control device is further configured to detect whether a grounded touch electrode exists in the touch panel under a condition that the user does not perform a fingerprint identification operation in the at least one first touch area, and control the grounded touch electrode in the touch panel to return to an operating state under a condition that the grounded touch electrode exists in the touch panel.

In some embodiments, the control device is further configured to detect whether there is a first touch area with a capacitance variation exceeding a variation threshold in the at least one first touch area in the touch panel, and take the first touch area with the capacitance variation exceeding the variation threshold as a first touch area for the user to perform the fingerprint identification operation under a condition that there is the first touch area with the capacitance variation exceeding the variation threshold.

In some embodiments, the control device is further configured to detect whether a duration of the capacitance variation exceeding a variation threshold exceeds a duration threshold under a condition that there is the first touch area where the capacitance variation exceeding the variation threshold, and take the first touch area where the capacitance variation exceeding the variation threshold as the first touch area where the user performs a fingerprint identification operation under a condition that the duration of the capacitance variation exceeding the variation threshold exceeds the duration threshold.

In some embodiments, the control device is further configured to send a first touch information to the touch electrodes in the first touch area where the user performs the fingerprint identification operation under a condition that the user performs the fingerprint identification operation in the at least one first touch area, and send a second touch information to the touch electrodes in the first touch area where the user performs a touch operation under a condition that the user performs the touch operation in the at least one first touch area, wherein a frequency of the first touch information is greater than a frequency of the second touch information.

According to a third aspect of the embodiments of the present disclosure, there is provided a control method of a touch panel, wherein the touch panel comprises at least one first touch area and at least one second touch area, wherein a density of touch electrodes in the at least one first touch area is greater than a density of touch electrodes in the at least one second touch area, the method comprising: detecting whether a user performs a fingerprint identification operation in the at least one first touch area; and controlling touch electrodes in touch areas in the touch panel other than a first touch area where the user performs the fingerprint identification operation to be grounded under a condition that the user performs the fingerprint identification operation in the at least one first touch area.

In some embodiments, detecting whether a grounded touch electrode exists in the touch panel under a condition that the user does not perform a fingerprint identification operation in the at least one first touch area; and controlling the grounded touch electrode in the touch panel to return to an operating state under a condition that the grounded touch electrode exists in the touch panel.

In some embodiments, the detecting of whether a user performs a fingerprint identification operation in the at least one first touch area comprises: detecting whether there is a first touch area with a capacitance variation exceeding a variation threshold in the at least one first touch area in the touch panel; and taking the first touch area with the capacitance variation exceeding the variation threshold as a first touch area for the user to perform the fingerprint identification operation under a condition that there is the first touch area with the capacitance variation exceeding the variation threshold.

In some embodiments, the detecting of whether a user performs a fingerprint identification operation in the at least one first touch area further comprises: detecting whether a duration of the capacitance variation exceeding a variation threshold exceeds a duration threshold under a condition that there is the first touch area where the capacitance variation exceeding the variation threshold; and taking the first touch area where the capacitance variation exceeding the variation threshold as the first touch area where the user performs a fingerprint identification operation under a condition that the duration of the capacitance variation exceeding the variation threshold exceeds the duration threshold.

In some embodiments, the control device is further configured to send a first touch information to the touch electrodes in the first touch area where the user performs the fingerprint identification operation under a condition that the user performs the fingerprint identification operation in the at least one first touch area; and send a second touch information to the touch electrodes in the first touch area where the user performs a touch operation under a condition that the user performs the touch operation in the at least one first touch area, wherein a frequency of the first touch information is greater than a frequency of the second touch information.

According to a fourth aspect of the embodiments of the present disclosure, there is provided a control device of a touch panel, a processor; and a memory coupled to the processor, storing program instructions which, when executed by the processor, cause the processor to implement the method according to any of the embodiments described above.

According to a fifth aspect of the embodiments of the present disclosure, there is provided a non-transitory computer-readable storage medium storing computer instructions which, when executed by a processor, implement the method according to any one of the embodiments described above.

Other features of the present disclosure and advantages thereof will become apparent from the following detailed description of exemplary embodiments thereof, which proceeds with reference to the accompanying drawings.

BRIEF DESCRIPTION OF THE DRAWINGS

The accompanying drawings, which are incorporated in and constitute a part of this specification, illustrate embodiments of the disclosure and together with the description, serve to explain the principles of the disclosure.

The present disclosure may be more clearly understood from the following detailed description taken in conjunction with the accompanying drawings, in which.

It should be understood that the dimensions of the various parts shown in the drawings are not drawn to scale. Further, the same or similar reference numerals denote the same or similar components.

DETAILED DESCRIPTION

Various exemplary embodiments of the present disclosure will now be described in detail with reference to the accompanying drawings. The description of the exemplary embodiments is merely illustrative and is in no way intended to limit the disclosure, its application, or uses. The present disclosure may be embodied in many different forms and is not limited to the embodiments described herein. These embodiments are provided so that this disclosure will be thorough and complete, and will fully convey the scope of the disclosure to those skilled in the art. It should be noted that: the relative arrangement of parts and steps, the composition of materials and values set forth in these embodiments are to be construed as illustrative only and not as limiting unless otherwise specifically stated.

The use of "first", "second", and similar words in this disclosure is not intended to indicate any order, quantity, or importance, but rather is used to distinguish one element from another. The word "comprise" or "include", and the like, means that the element preceding the word comprises the element listed after the word, and does not exclude the possibility that other elements may also be included.

All terms (including technical or scientific terms) used herein have the same meaning as commonly understood by one of ordinary skill in the art to which this disclosure belongs unless specifically defined otherwise. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Techniques, methods, and apparatus known to one of ordinary skill in the relevant art may not be discussed in detail but are intended to be part of the specification where appropriate.

The inventors found out through research that a density of the touch electrodes required for realizing fingerprint identification is greater than a density of the touch electrodes required for realizing touch operation. A cost is increased if high-density touch electrodes are disposed in each area of the touch panel to realize fingerprint recognition.

Accordingly, the present disclosure provides a solution of effectively reducing cost under a condition that the touch operation and the fingerprint identification operation can be performed on the touch panel.

Figure 1:
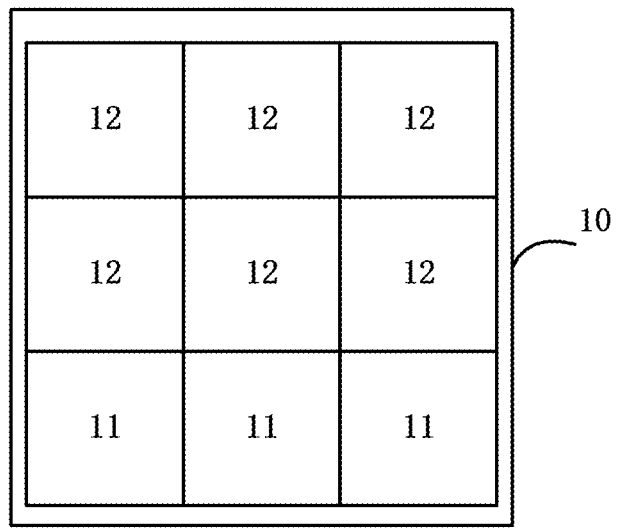
FIG. 1 is a schematic structural diagram of a touch panel according to one embodiment of the present disclosure.

FIG. 1 is a schematic structural diagram of a touch panel according to one embodiment of the present disclosure.

As shown in FIG. 1, a touch panel 10 includes at least one first touch area 11 and at least one second touch area 12. A density of the touch electrodes in the first touch area 11 is greater than a density of the touch electrodes in the second touch area 12. The touch electrodes in the first touch area 11 are smaller than the touch electrodes in the second touch area 12.

The density of the touch electrodes in the first touch area 11 is greater, so that the first touch area 11 can be used for both touch operation and fingerprint identification operation. The density of the touch electrodes in the second touch area 12 is smaller, so the second touch area 12 is only used for touch operation.

In some embodiments, the touch electrodes in the first touch area 11 and the second touch area 12 are self-capacitance electrodes or mutual capacitance electrodes.

As shown in FIG. 1, a plurality of first touch areas 11 are disposed on the touch panel 10 in an area that is easily touched by a finger of a user, and a plurality of second touch areas 12 are disposed on other areas of the touch panel 10 for easier operation. Therefore, the user can performs the fingerprint identification operation through the first touch area 11 while performing the touch operation in any area of the touch panel. In the present disclosure, the cost can be effectively reduced under a condition that the touch control operation and the fingerprint identification operation are realized on the touch panel.

In some embodiments, shapes of the first touch area 11 and the second touch area 12 are rectangular, square or other shapes convenient for the user to operate.

In some embodiments, side lengths of the first touch area 11 and the second touch area 12 are 4 mm to 5 mm. For example, the first touch area 11 and the second touch area 12 are 4.5 mm×4.5 mm squares.

Figure 2:
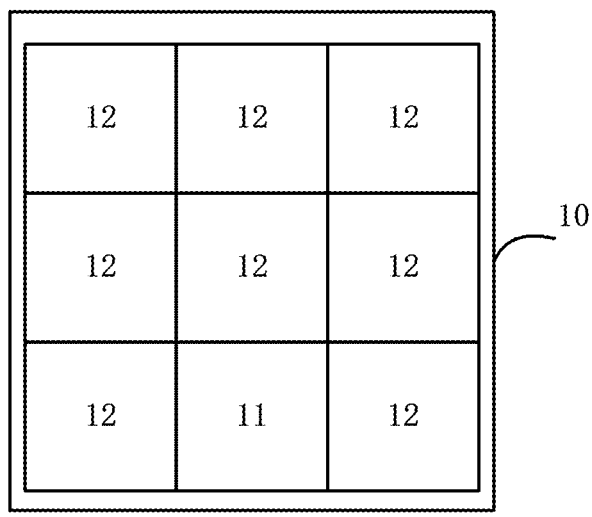
FIG. 2 is a schematic structural diagram of a touch panel according to another embodiment of the present disclosure.

FIG. 2 is a schematic structural diagram of a touch panel according to another embodiment of the disclosure.

FIG. 2 differs from FIG. 1 in that, in the embodiment shown in FIG. 1, the touch panel 10 includes a plurality of first touch areas 11. In the embodiment shown in FIG. 2, the touch panel 10 includes only one touch area 11. Therefore, the cost can be further reduced under a condition of realizing touch operation and fingerprint identification operation.

Figure 3:
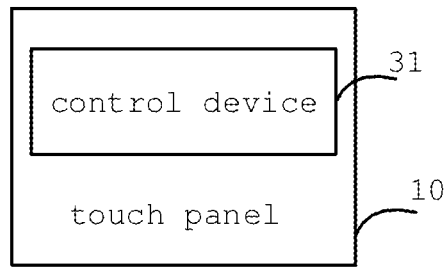
FIG. 3 is a schematic structural diagram of a touch panel according to still another embodiment of the present disclosure.

FIG. 3 is a schematic structural diagram of a touch panel according to still another embodiment of the present disclosure. As shown in FIG. 3, the touch panel 10 further includes a control device 31.

The control device 31 is configured to detect whether a user performs a fingerprint identification operation in the at least one first touch area. The control device 31 controls touch electrodes in touch areas in the touch panel 10 other than a first touch area where the user performs the fingerprint identification operation to be grounded under a condition that the user performs the fingerprint identification operation in the at least one first touch area.

In the process of fingerprint identification operation performed by the user through the touch panel 10, a capacitance between the touch electrodes in the corresponding first touch area changes. Through detecting the capacitance variation of each touch area, a first touch area where a user performs the fingerprint identification operation can be determined.

In some embodiments, the control device 31 is further configured to detect whether a grounded touch electrode exists in the touch panel 10 under a condition that the user does not perform a fingerprint identification operation in the at least one first touch area. The control device 31 controls the grounded touch electrode in the touch panel to return to an operating state under a condition that the grounded touch electrode exists in the touch panel 10.

That is, under a condition that the user does not perform the fingerprint recognition operation, the control device 31 returns the grounded touch electrode to the state before the grounding, thereby ensuring that the normal function of the touch panel 10 is not affected.

In some embodiments, the control device 31 is further configured to detect whether there is a first touch area with a capacitance variation exceeding a variation threshold in the at least one first touch area. The control device 31 takes the first touch area with the capacitance variation exceeding the variation threshold as a first touch area for the user to perform the fingerprint identification operation under a condition that there is the first touch area with the capacitance variation exceeding the variation threshold.

It should be noted that, comparing to other touch operations, a contact area between a finger and the touch area is larger when the user performs a fingerprint identification operation, thereby causing a larger amount of capacitance variation in the touch area where the operation is performed. Therefore, the operation type of the user can be accurately identified by detecting the capacitance variation.

In some embodiments, the control device 31 is further configured to detect whether a duration of the capacitance variation exceeding a variation threshold exceeds a duration threshold under a condition that there is the first touch area where the capacitance variation exceeding the variation threshold. The control device 31 takes the first touch area where the capacitance variation exceeding the variation threshold as the first touch area where the user performs a fingerprint identification operation under a condition that the duration of the capacitance variation exceeding the variation threshold exceeds the duration threshold.

It should be noted that, comparing to other touch operations, a contact time between the finger and the touch area is longer when the user performs the fingerprint identification operation. Therefore, by detecting the duration during which the capacitance variation exceeds the variation threshold, it is possible to determine the user operation accurately.

In some embodiments, the control device 31 is further configured to update at least one of the variation threshold and the duration threshold according to a setting of the user.

Because different users have different operation habits, a contact area and a contact time of a finger and the touch panel 10 are different during fingerprint identification. Through the personalized setting of the variable quantity threshold and the duration threshold, the user experience can be further improved.

In some embodiments, the control device 31 sends a first touch information to the touch electrodes in the first touch area where the user performs the fingerprint identification operation under a condition that the user performs the fingerprint identification operation in the at least one first touch area. The control device 31 sends a second touch information to the touch electrodes in the first touch area where the user performs the touch operation under a condition that the user performs the touch operation in the at least one first touch area, wherein a frequency of the first touch information is greater than a frequency of the second touch information.

It should be noted that a frequency of the first touch signal is greater than a frequency of the second touch signal, thereby ensuring the accuracy of fingerprint identification.

In some embodiments, the control device 31 may be implemented as a general purpose Processor, a Programmable Logic Controller (PLC), a Digital Signal Processor (DSP), an Application Specific Integrated Circuit (ASIC), a Field-Programmable Gate Array (FPGA) or other Programmable Logic device, discrete Gate or transistor Logic, discrete hardware components, or any suitable combination thereof for performing the functions described in the present disclosure.

The present disclosure also provides a display device. The display device includes the touch panel provided in any one of FIG. 1 to FIG. 3. The display device can be any product or component with a display function, such as a display, a mobile phone, a tablet personal computer, a television, a notebook computer, a digital photo frame, a navigator and the like.

Figure 4:
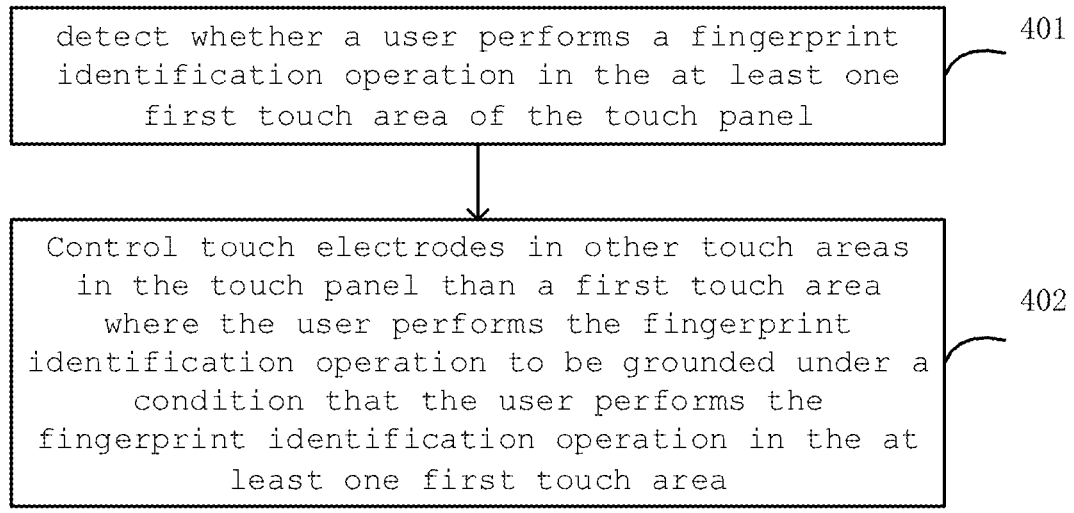
FIG. 4 is a flowchart illustrating a touch panel control method according to one embodiment of the present disclosure.

FIG. 4 is a flowchart illustrating a touch panel control method according to an embodiment of the disclosure. The touch panel is the touch panel according to any one of the embodiments of FIGS. 1 to 3. In some embodiments, the touch panel control method is performed by a touch panel control device.

In step 401, it is detected whether a user performs a fingerprint identification operation in the at least one first touch area of the touch panel.

In the process of fingerprint identification operation performed by a user through the touch panel, a capacitance between the touch electrodes in the corresponding first touch area changes. Through detecting the capacitance variation of each touch area, a first touch area where a user performs fingerprint identification operation can be determined.

In step 402, touch electrodes in touch areas in the touch panel other than a first touch area where the user performs the fingerprint identification operation are controlled to be grounded under a condition that the user performs the fingerprint identification operation in the at least one first touch area.

In the touch panel control method provided in the above embodiment of the present disclosure, touch electrodes in touch areas in the touch panel other than a first touch area where the user performs the fingerprint identification operation are controlled to be grounded under a condition that the user performs the fingerprint identification operation in the at least one first touch area. Therefore, a parasitic capacitance generated by the touch electrode which does not participate in the fingerprint identification operation is effectively reduced, and the accuracy of fingerprint identification is improved.

In some embodiments, it is detected whether a grounded touch electrode exists in the touch panel under a condition that the user does not perform a fingerprint identification operation in the at least one first touch area. The grounded touch electrode in the touch panel is controlled to return to an operating state under a condition that the grounded touch electrode exists in the touch panel. That is, all the touch electrodes in the touch panel are not grounded. By returning the grounded touch electrode to the state before grounding, it is ensured that the normal function of the touch panel is not affected.

Figure 5:
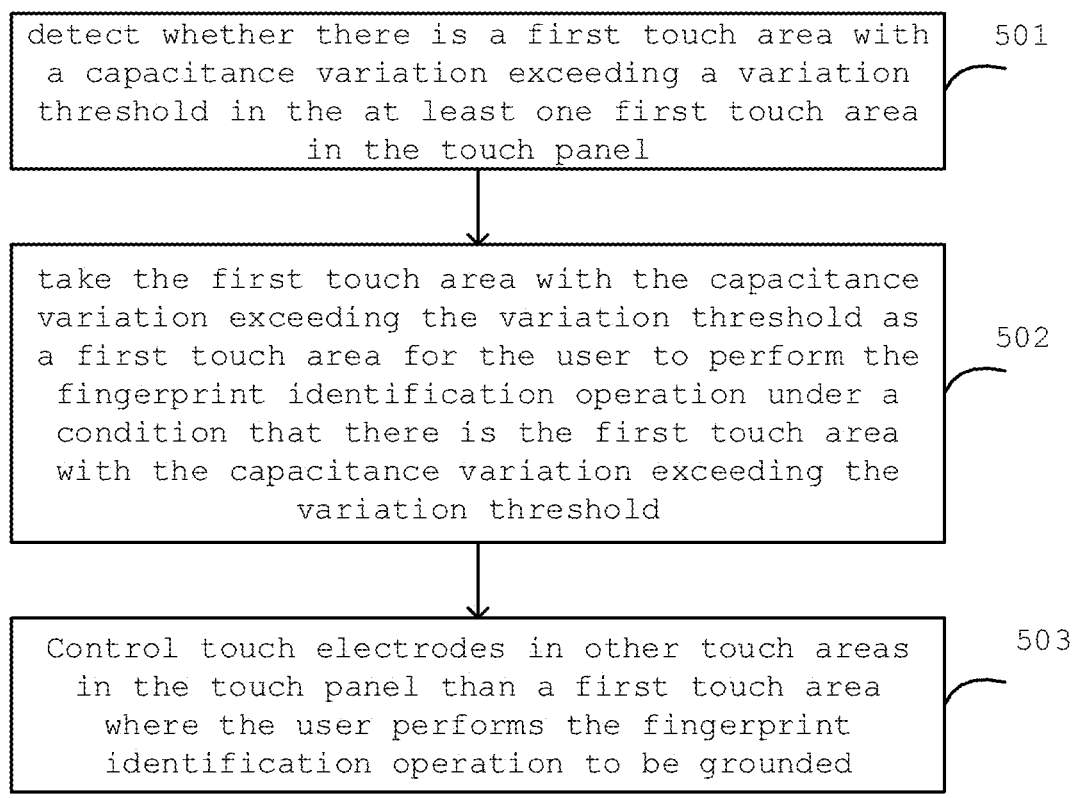
FIG. 5 is a flowchart illustrating a touch panel control method according to another embodiment of the present disclosure.

FIG. 5 is a flowchart illustrating a touch panel control method according to another embodiment of the disclosure. The touch panel is a touch panel according to any one of the embodiments of FIGS. 1 to 3. In some embodiments, the touch panel control method is performed by a touch panel control device.

In step 501, it is detected whether there is a first touch area with a capacitance variation exceeding a variation threshold in the at least one first touch area in the touch panel.

It should be noted that, comparing to other touch operations, the contact area between the finger and the touch area is larger when the user performs a fingerprint identification operation. This results in a larger amount of capacitance variation in the touch area where the fingerprint recognition operation is performed. By detecting the capacitance variation, the operation type of the user can be accurately identified.

In step 502, the first touch area with the capacitance variation exceeding the variation threshold is taken as a first touch area for the user to perform the fingerprint identification operation under a condition that there is the first touch area with the capacitance variation exceeding the variation threshold.

In step 503, touch electrodes in touch areas in the touch panel other than a first touch area where the user performs the fingerprint identification operation are controlled to be grounded.

Figure 6:
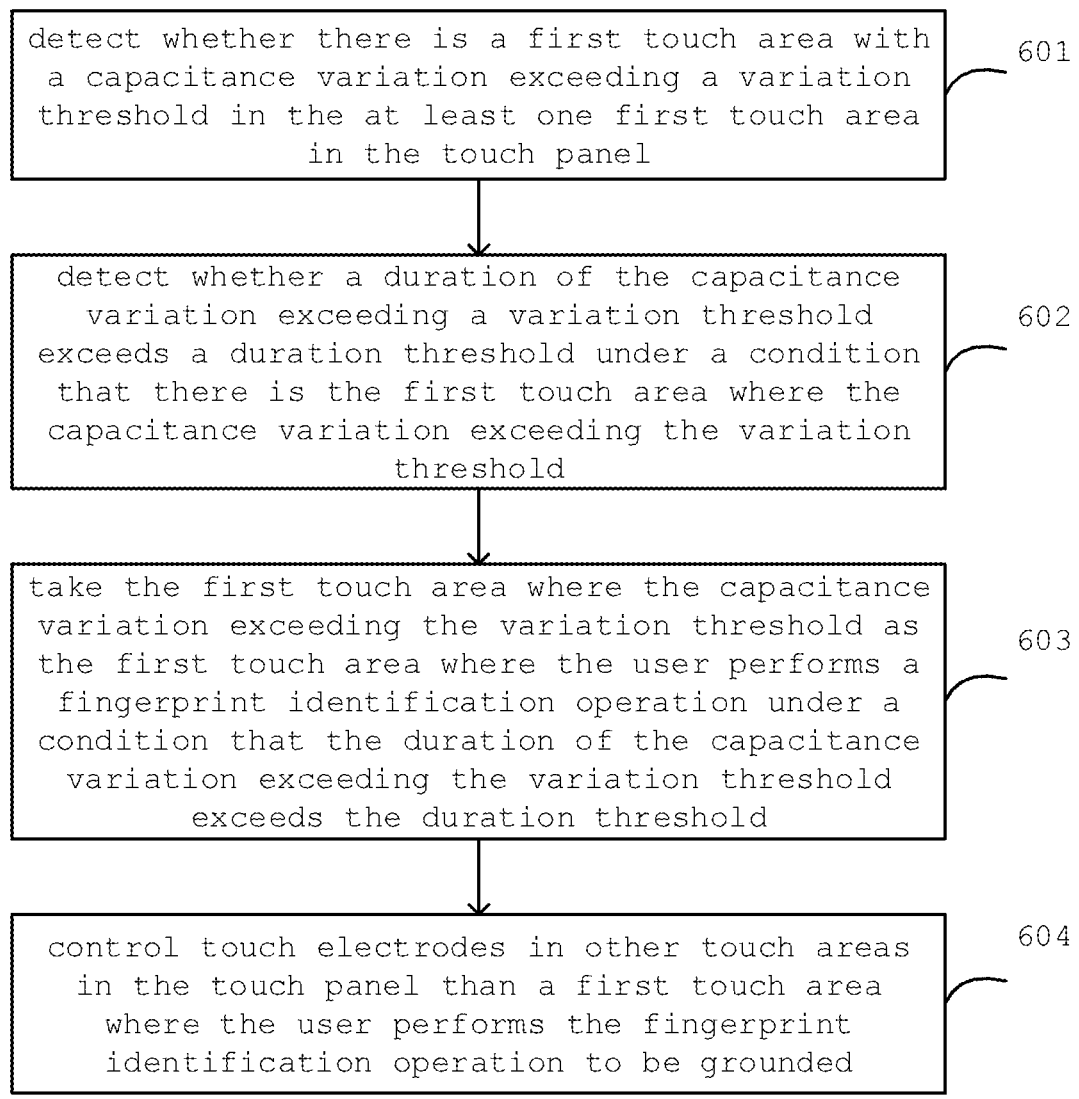
FIG. 6 is a flowchart illustrating a touch panel control method according to still another embodiment of the present disclosure.

FIG. 6 is a flowchart illustrating a touch panel control method according to still another embodiment of the disclosure. The touch panel is a touch panel according to any one of the embodiments of FIGS. 1 to 3. In some embodiments, the touch panel control method is performed by a touch panel control device.

In step 601, it is detected whether there is a first touch area with a capacitance variation exceeding a variation threshold in the at least one first touch area in the touch panel.

In step 602, it is detected whether a duration of the capacitance variation exceeding a variation threshold exceeds a duration threshold under a condition that there is the first touch area where the capacitance variation exceeding the variation threshold.

It should be noted that, comparing to other touch operations, the contact time between the finger and the touch area is longer when the user performs the fingerprint identification operation. By detecting the duration that the capacitance variation exceeds the variation threshold, the user operation can be accurately detected.

In step 603, the first touch area where the capacitance variation exceeding the variation threshold is taken as the first touch area where the user performs a fingerprint identification operation under a condition that the duration of the capacitance variation exceeding the variation threshold exceeds the duration threshold.

In step 604, touch electrodes in touch areas in the touch other panel than a first touch area where the user performs the fingerprint identification operation are controlled to be grounded.

In some embodiments, at least one of the variation threshold and the duration threshold is updated according to a user setting.

Because different users have different operation habits, the contact area and the contact time of a finger and the touch panel are different during fingerprint identification. Through the personalized setting of the variable quantity threshold and the duration threshold, the user experience can be further improved.

In some embodiments, a first touch information is sent to the touch electrodes in the first touch area where the user performs the fingerprint identification operation under a condition that the user performs the fingerprint identification operation in the at least one first touch area and a second touch information is sent to the touch electrodes in the first touch area where the user performs a touch operation under a condition that the user performs the touch operation in the at least one first touch area. It should be noted that a frequency of the first touch information is greater than a frequency of the second touch information, thereby ensuring the accuracy of fingerprint identification.

Figure 7:
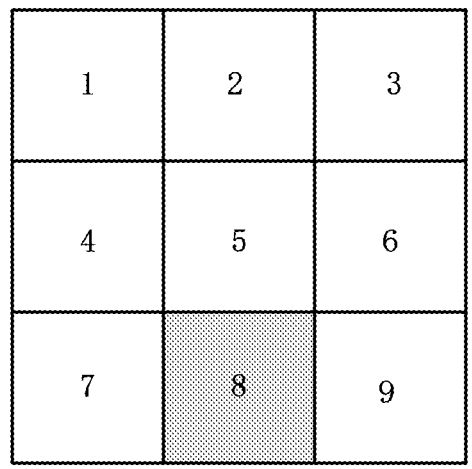
FIG. 7 is a schematic diagram of touch area partitioning according to one embodiment of the present disclosure.

FIG. 7 is a schematic diagram of touch area division according to an embodiment of the present disclosure.

As shown in FIG. 7, the touch panel includes 9 touch areas. The touch areas 1-6 are second touch areas only used for touch operation, and the touch areas 7-9 are first touch areas used for touch operation and fingerprint identification operation at the same time. A density of the touch electrodes in the first touch area is greater than a density of the touch electrodes in the second touch area. When a user performs a fingerprint identification operation through the 8th touch area, if the touch electrodes in the touch areas 1-7 and 9 are still in a working state, a generated parasitic capacitance may affect the fingerprint identification operation performed in the 8th touch area. In the solution provided in the present disclosure, under a condition that the user carries out fingerprint identification operation through the 8th touch control area, the touch electrodes in the touch areas 1-7 and 9 are grounded to effectively reduce the influence of the parasitic capacitance to fingerprint identification operation, thereby improving the accuracy of fingerprint identification.

Figure 8:
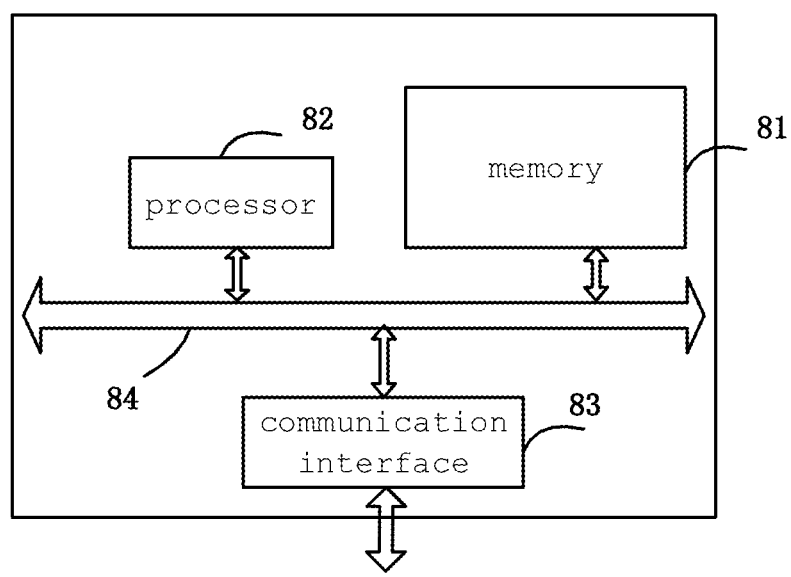
FIG. 8 is a schematic structural diagram of a touch panel control device according to an embodiment of the present disclosure.

FIG. 8 is a schematic structural diagram of a touch panel control device according to an embodiment of the present disclosure. As shown in FIG. 8, the touch panel control device includes a memory 81 and a processor 82.

The memory 81 is used to store instructions. The processor 82 is coupled to the memory 81. The processor 82 is configured to perform a method as described in relation to any of the embodiments of FIGS. 4-6 based on the instructions stored in the memory.

As shown in FIG. 8, the touch panel control device further includes a communication interface 83 for information interaction with other devices. Meanwhile, the touch panel control device further comprises a bus 84, and the processor 82, the communication interface 83 and the memory 81 are communicated with each other through the bus 84.

The Memory 81 may include a Random Access Memory (RAM) or a Non-Volatile Memory (NVM), such as at least one disk memory. The memory 81 may also be a memory array. The memory 81 may also be partitioned into blocks, and the blocks may be combined into virtual volumes according to certain rules.

Further, the processor 82 may be a central processing unit, or may be an ASIC (Application Specific Integrated Circuit), or one or more integrated circuits configured to implement embodiments of the present disclosure.

The present disclosure also provides a non-transitory computer-readable storage medium. The computer readable storage medium stores computer instructions, and when executed by the processor, the instructions implement the method according to any one of FIGS. 4 to 6.

So far, embodiments of the present disclosure have been described in detail. Some details well known in the art have not been described in order to avoid obscuring the concepts of the present disclosure. Those skilled in the art can now fully appreciate how to implement the teachings disclosed herein, in view of the foregoing description.

Although some specific embodiments of the present disclosure have been described in detail by way of example, it should be understood by those skilled in the art that the above examples are for illustration only and are not intended to limit the scope of the present disclosure. It will be understood by those skilled in the art that various changes may be made and equivalents may be substituted for elements thereof without departing from the scope and spirit of the present disclosure. The scope of the present disclosure is defined by the appended claims.

What is claimed is:

1. A touch panel, comprising:
   at least one first touch area and at least one second touch area,
   wherein a density of touch electrodes in the at least one first touch area is greater than a density of touch electrodes in the at least one second touch area; and
   a control device configured to detect whether a user performs a fingerprint identification operation in the at least one first touch area, and control touch electrodes in touch areas in the touch panel other than a first touch area where the user performs the fingerprint identification operation to be grounded under a condition that the user performs the fingerprint identification operation in the at least one first touch area, wherein the control device is configured to send a first touch information to the touch electrodes in the first touch area where the user performs the fingerprint identification operation under a condition that the user performs the fingerprint identification operation in the at least one first touch area, and send a second touch information to the touch electrodes in the first touch area where the user performs a touch operation under a condition that the user performs the touch operation in the at least one first touch area, wherein a frequency of the first touch information is greater than a frequency of the second touch information.

2. The touch panel of claim 1, wherein each of the at least one first touch area and each of the at least one second touch area have a side length of 4 mm to 5 mm.

3. The touch panel according to claim 1, wherein the control device is further configured to detect whether a grounded touch electrode exists in the touch panel under a condition that the user does not perform a fingerprint identification operation in the at least one first touch area, and control the grounded touch electrode in the touch panel to return to an operating state under a condition that the grounded touch electrode exists in the touch panel.

4. The touch panel according to claim 1, wherein the control device is further configured to detect whether there is a first touch area with a capacitance variation exceeding a variation threshold in the at least one first touch area in the touch panel, and take the first touch area with the capacitance variation exceeding the variation threshold as a first touch area for the user to perform the fingerprint identification operation under a condition that there is the first touch area with the capacitance variation exceeding the variation threshold.

5. The touch panel according to claim 4, wherein the control device is further configured to detect whether a duration of the capacitance variation exceeding a variation threshold exceeds a duration threshold under a condition that there is the first touch area where the capacitance variation exceeding the variation threshold, and take the first touch area where the capacitance variation exceeding the variation threshold as the first touch area where the user performs a fingerprint identification operation under a condition that the duration of the capacitance variation exceeding the variation threshold exceeds the duration threshold.

6. A display device, comprising a touch panel, the touch panel comprising:
at least one first touch area and at least one second touch area,
wherein a density of touch electrodes in the at least one first touch area is greater than a density of touch electrodes in the at least one second touch area; and
a control device configured to detect whether a user performs a fingerprint identification operation in the at least one first touch area, and control touch electrodes in touch areas in the touch panel other than a first touch area where the user performs the fingerprint identification operation to be grounded under a condition that the user performs the fingerprint identification operation in the at least one first touch area, wherein the control device is configured to send a first touch information to the touch electrodes in the first touch area where the user performs the fingerprint identification operation under a condition that the user performs the fingerprint identification operation in the at least one first touch area, and send a second touch information to the touch electrodes in the first touch area where the user performs a touch operation under a condition that the user performs the touch operation in the at least one first touch area, wherein a frequency of the first touch information is greater than a frequency of the second touch information.

7. The display device according to claim 6, wherein
the control device is further configured to detect whether a grounded touch electrode exists in the touch panel under a condition that the user does not perform a fingerprint identification operation in the at least one first touch area, and control the grounded touch electrode in the touch panel to return to an operating state under a condition that the grounded touch electrode exists in the touch panel.

8. The display device according to claim 6, wherein
the control device is further configured to detect whether there is a first touch area with a capacitance variation exceeding a variation threshold in the at least one first touch area in the touch panel, and take the first touch area with the capacitance variation exceeding the variation threshold as a first touch area for the user to perform the fingerprint identification operation under a condition that there is the first touch area with the capacitance variation exceeding the variation threshold.

9. The display device according to claim 8, wherein
the control device is further configured to detect whether a duration of the capacitance variation exceeding a variation threshold exceeds a duration threshold under a condition that there is the first touch area where the capacitance variation exceeding the variation threshold, and take the first touch area where the capacitance variation exceeding the variation threshold as the first touch area where the user performs a fingerprint identification operation under a condition that the duration of the capacitance variation exceeding the variation threshold exceeds the duration threshold.

10. A control method of a touch panel, the touch panel comprising at least one first touch area and at least one second touch area, wherein a density of touch electrodes in the at least one first touch area is greater than a density of touch electrodes in the at least one second touch area, the control method comprising:
detecting whether a user performs a fingerprint identification operation in the at least one first touch area;
controlling touch electrodes in touch areas in the touch panel other than a first touch area where the user performs the fingerprint identification operation to be grounded under a condition that the user performs the fingerprint identification operation in the at least one first touch area;
sending a first touch information to the touch electrodes in the first touch area where the user performs the fingerprint identification operation under a condition that the user performs the fingerprint identification operation in the at least one first touch area; and
sending a second touch information to the touch electrodes in the first touch area where the user performs a touch operation under a condition that the user performs the touch operation in the at least one first touch area, wherein a frequency of the first touch information is greater than a frequency of the second touch information.

11. The control method according to claim 10, further comprising:
detecting whether a grounded touch electrode exists in the touch panel under a condition that the user does not perform a fingerprint identification operation in the at least one first touch area; and
controlling the grounded touch electrode in the touch panel to return to an operating state under a condition that the grounded touch electrode exists in the touch panel.

12. The control method according to claim 10, wherein the detecting of whether a user performs a fingerprint identification operation in the at least one first touch area comprises:

detecting whether there is a first touch area with a capacitance variation exceeding a variation threshold in the at least one first touch area in the touch panel; and taking the first touch area with the capacitance variation exceeding the variation threshold as a first touch area for the user to perform the fingerprint identification operation under a condition that there is the first touch area with the capacitance variation exceeding the variation threshold.

13. The control method according to claim 12, wherein the detecting of whether a user performs a fingerprint identification operation in the at least one first touch area further comprises:

detecting whether a duration of the capacitance variation exceeding a variation threshold exceeds a duration threshold under a condition that there is the first touch area where the capacitance variation exceeding the variation threshold; and taking the first touch area where the capacitance variation exceeding the variation threshold as the first touch area where the user performs a fingerprint identification operation under a condition that the duration of the capacitance variation exceeding the variation threshold exceeds the duration threshold.

14. A control device of the touch panel, comprising:

a processor; and a memory coupled to the processor, storing program instructions which, when executed by the processor, cause the processor to implement the method of claim 10.

15. A non-transitory computer readable storage medium, wherein the computer readable storage medium stores computer instructions which, when executed by a processor, implement the method of claim 10.

\* \* \* \* \*